US 6,743,296 B2

(12) United States Patent
Kao

(10) Patent No.: US 6,743,296 B2
(45) Date of Patent: Jun. 1, 2004

(54) APPARATUS AND METHOD FOR SELF-CENTERING A WAFER IN A SPUTTER CHAMBER

(75) Inventor: Chung-En Kao, Miau Lih (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/976,082

(22) Filed: Oct. 12, 2001

(65) Prior Publication Data

US 2003/0070915 A1 Apr. 17, 2003

(51) Int. Cl.⁷ .................. B05C 13/00; C23C 14/34; B23Q 1/00
(52) U.S. Cl. .................. 118/500; 204/298.15; 427/445; 248/363; 269/16; 269/53; 269/55; 269/904
(58) Field of Search .................. 427/445; 204/192.1, 204/298.15; 118/500; 248/363; 269/16, 53, 55, 904

(56) References Cited

U.S. PATENT DOCUMENTS 5,114,556 A * 5/1992 Lamont, Jr. ............. 204/192.12
5,958,198 A * 9/1999 Banholzer et al. ...... 204/298.15

* cited by examiner

Primary Examiner—Steven VerSteeg
(74) Attorney, Agent, or Firm—Tung & Associates

(57) ABSTRACT

A wafer lifter for self-centering a wafer onto a wafer pedestal situated in a physical vapor deposition chamber and a method for self-centering a wafer onto the wafer pedestal are described. The wafer lifter is constructed by a lifter body of annular shape, at least four support fingers emanating upwardly from the wafer lifter body and are spaced-apart from each other, and a platform on a tip portion of each of the at least four support fingers defined by a slanted surface from a vertical plane of an outside surface of the support finger. The platform, when supporting a wafer thereon, leaves substantially no gap between the slanted surface and an outer periphery of the wafer.

12 Claims, 2 Drawing Sheets

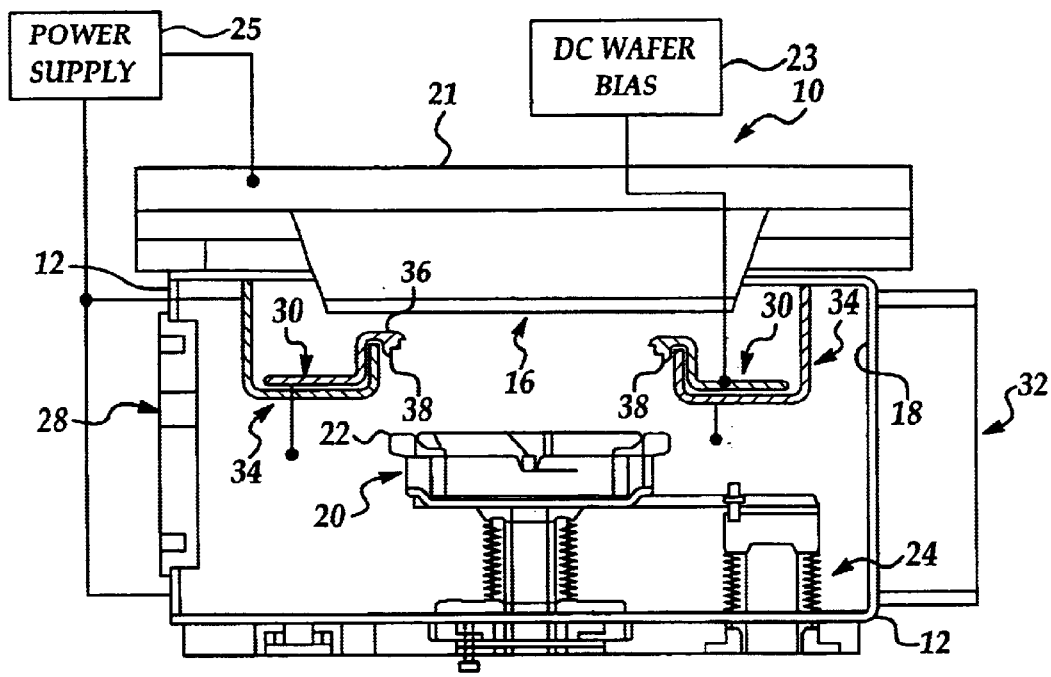
*Figure 1*
*Prior Art*
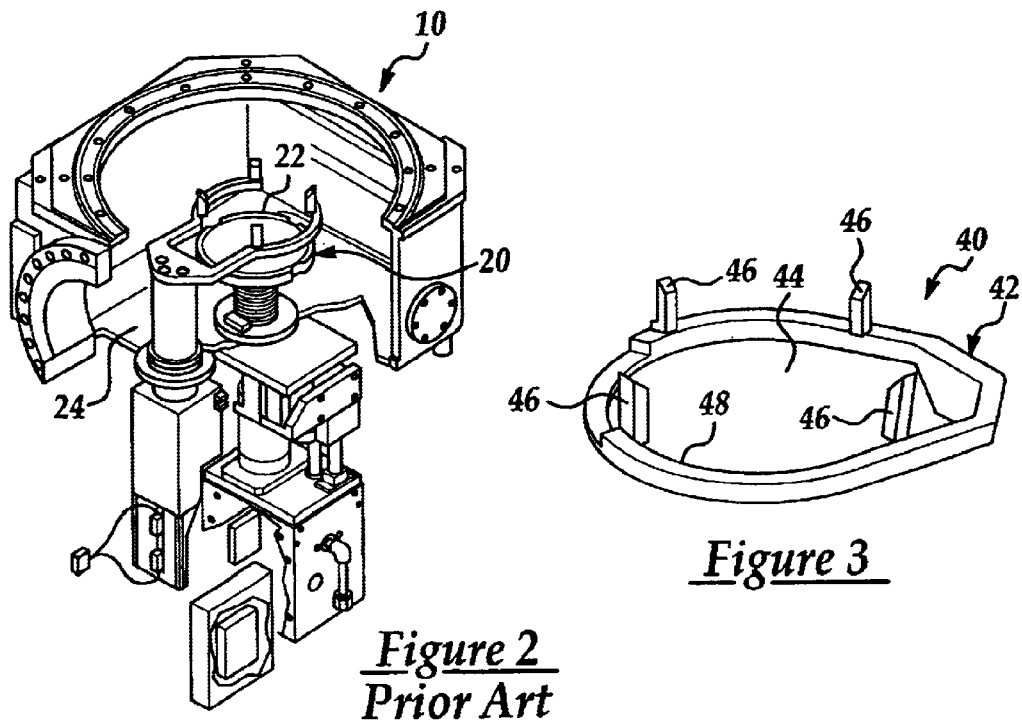
*Figure 2*
*Prior Art*
*Figure 3*

APPARATUS AND METHOD FOR SELF-CENTERING A WAFER IN A SPUTTER CHAMBER

FIELD OF THE INVENTION

The present invention generally relates to an apparatus and a method for loading a wafer into a physical vapor deposition chamber and more particularly, relates to an apparatus and a method for self-centering a wafer onto a wafer pedestal situated in a physical vapor deposition chamber.

BACKGROUND OF THE INVENTION

Physical vapor deposition (PVD) or sputter deposition is a frequently used processing technique in the manufacturing of semiconductor devices that involves the deposition of a metallic layer on the surface of a semiconductor device. The physical vapor deposition technique is more frequently known as a sputtering technique. In more recently developed semiconductor fabrication processes, the sputtering technique is used to deposit metallic layers of tungsten or titanium tungsten as contact layers.

In a sputtering process, inert gas particles such as those of argon or nitrogen, are first ionized in an electric field to produce a gas plasma and then attracted toward a source or a target where the energy of the gas particles physically dislodges, i.e., sputters off, atoms of the metallic or other source material. The sputtering technique is very versatile in that various materials can be deposited utilizing not only RF but also DC power sources.

In a typical sputter chamber, the major components utilized include a stainless steel chamber that is vacuum-tight and is equipped with a helium leak detector, a pump that has the capacity to reduce the chamber pressure to at least $10^{-6}$ torr or below, various pressure gauges, a sputter source or target, a RF or DC power supply, a wafer holder, a chamber shield and a clamp ring. The sputter source is normally mounted on the roof of the chamber such that it faces a wafer holder positioned in the center of the chamber facing each other. The sputter source utilized can be a W or TiW disc for a process in which W or TiW is sputtered. A typical sputter chamber is that supplied by the Applied Materials, Inc. of Santa Clara, Calif. under the trade name of ENDURA®. In some of the sputter chambers, the wafer holder is structured as a pedestal which includes an internal resistive heater.

One of the more important components in the sputter chamber is the clamp ring which serves two purposes during a sputter process. The first purpose is to clamp the wafer to the pedestal heater. The clamp ring holds the wafer in place on the pedestal when a positive gas pressure is applied between the heater and the pedestal such that heat can be efficiently conducted from the heater to the wafer. The second purpose served by the clamp ring is to allow a predetermined flow of argon to leak from under the wafer into the sputter chamber. The clamp ring is generally constructed in a circular shape with an oriented cut-out to match a wafer's flat contour. A hood is built into the clamp ring and is used for shadowing purpose to protect the lip of the clamp ring from being coated by the sputtered metal particles. The lip portion also allows the force of the clamp ring to be evenly distributed around the wafer.

A cross-sectional view of a typical sputter chamber 10 is shown in FIG. 1. Sputter chamber 10 is constructed by a stainless steel chamber body 12 that is vacuum-tight, a sputter target 16 of W, TiW or Sn, a wafer holder 20 equipped with a heater 22, a wafer lift mechanism 24, a wafer port 28, a pumping port 32, a clamp ring 30 and a chamber shield 34. A DC power supply 25 is connected to a target 16 and a conductive part of the chamber, such as the chamber wall 18 or chamber shield 34, thereby establishing a voltage potential between the grounded chamber wall 18 and the target 16. A DC bias circuit 23 is connected to the clamping ring and thus applies a DC bias to the wafer (not shown). The hood 36 of the clamp ring 30 protects the tip 38 from being coated by the sputtered particles. A perspective view of the same sputter chamber 10 is shown in FIG. 2.

As shown in FIG. 1, the chamber shield 34 is another important component in the sputter chamber 10. It forms a seal between the clamp ring 30 and the chamber body 12 such that sputtered particles from the sputter target 16 do not contaminate the chamber wall 18 during a sputtering process. It should be noted that, during the sputtering process, the wafer pedestal 20 is in a raised position with the tip portion 38 of the clamp ring 30 touching the heater 22 on the pedestal 20. In order to achieve a tight seal from the chamber wall 18, a small gap is normally maintained between the clamp ring 30 and the chamber shield 34. In a typical metal sputtering process where a W, TiW, Sn or other metal is used in the sputter chamber, the emission of sputtered particles of the metals is shaped with a forward cosine distribution such that a more desirable deposition process in which metal particles are deposited uniformly at the center and the edge of the wafer can be achieved.

One of the processing difficulties incurred in a sputtering chamber is the placement of the wafer on the wafer pedestal. When a wafer is not positioned at a perfectly centered position on a wafer pedestal, i.e., the wafer position has shifted away from the center, subsequent metal deposition process produces a wafer that has thinner coating on one edge which will then lead to defocusing during photolithography resulting in defective dies being produced on the wafer edge. The defective dies result in a low yield of the physical vapor deposition process. It is therefore an important task during the fabrication process to center a wafer on a wafer pedestal properly before a deposition is to take place.

It is therefore an object of the present invention to provide an apparatus for self-centering a wafer on a wafer pedestal that does not have the drawbacks or shortcomings of the conventional apparatus.

It is another object of the present invention to provide an apparatus for self-centering a wafer on a wafer pedestal situated in a physical vapor deposition chamber that does not require any additional processing step.

It is a further object of the present invention to provide an apparatus for self-centering a wafer on a wafer pedestal in a sputtering chamber by using a modified wafer lifter equipped with at least four support fingers.

It is another further object of the present invention to provide a wafer lifter for self-centering a wafer on a pedestal by providing four support fingers on a lifter body that are each equipped with a slanted surface for contacting the wafer and for performing the self-centering function.

It is still another object of the present invention to provide a wafer lifter for self-centering a wafer on a pedestal situated in a physical vapor deposition chamber by utilizing a modified hoop equipped with improved support fingers.

It is yet another object of the present invention to provide a method for self-centering a wafer on a wafer pedestal by utilizing a modified wafer lifter equipped with improved wafer support fingers.

SUMMARY OF THE INVENTION

In accordance with the present invention, an apparatus and a method for self-centering a wafer on a wafer pedestal in a physical vapor deposition chamber are provided.

In a preferred embodiment, a wafer lifter for self-centering a wafer on a pedestal may be provided which includes a lifter body of annular shape that has a center cavity with a diameter that is larger than a diameter of the wafer pedestal; at least four support fingers emanating upwardly from the lifter body and are spaced-apart from each other; and a platform on a tip portion of each of the at least four support fingers defined by a surface slanted from a vertical plane of an outside surface of the support finger; the platform, when supporting a wafer thereon, leaves substantially no gap between the slanted surface and an outer periphery of the wafer.

In the wafer lifter for self-centering a wafer onto a wafer pedestal, the platform may be defined by a slanted shoulder portion of the support finger. A base of the slanted shoulder portion of the support finger defines a diameter of a circular area surrounded by the platforms of the at least four support fingers which is not larger than a diameter of the wafer when measured at 23° C. The at least four support fingers may be substantially equally spaced-apart from each other. The platform, when supporting a wafer thereon may leave a gap smaller than 0.5 mm between the slanted surface and the outer periphery of the wafer. The lifter body may be fabricated of a material that has a rigidity of at least that of aluminum. The lifter body may be equipped with four support fingers emanating upwardly from the body, or the four support fingers may be emanating upwardly at a 90° angle from the body. The lifter body may have a ring shape.

The present invention is further directed to a method for self-centering a wafer on a wafer pedestal which can be carried out by the operating steps of first providing a wafer lifter that includes a lifter body of annular shape that has a center cavity with a diameter that is larger than a diameter of the wafer pedestal, at least four support fingers emanating upwardly from the lifter body and are spaced-apart from each other, and a platform on a tip portion of each of the at least four support fingers defined by a slanted surface from a vertical plane of an outside surface of the support finger, the platform when supporting a wafer thereon leaves no gap between the slanted surface and an outer periphery of the wafer; positioning a wafer on the wafer lifter supported by the platform on the tip portion of the at least four support fingers; and lifting the wafer lifter to a position over the wafer pedestal and depositing the wafer onto the pedestal.

The method for self-centering a wafer on a wafer pedestal may further include the step, after the lifting step, of lowering the wafer lifter to deposit the wafer onto the wafer pedestal, or the step of sputter depositing a metal layer on a top surface of the wafer. The method may further include the step of self-centering the wafer on the wafer lifter during the positioning step when the wafer is guided into a center position by the sloped surface on the tip portion of the at least four support fingers, or the step of providing four support fingers that are vertically mounted on the lifter body. The method may further include a step of fabricating the lifter body with a material that has a rigidity of at least that of aluminum, or the step of fabricating the lifter body with aluminum or stainless steel.

BRIEF DESCRIPTION OF THE DRAWINGS

These and other objects, features and advantages of the present invention will become apparent from the following detailed description and the appended drawings in which:

FIG. 1 is a cross-sectional view of a conventional physical vapor deposition chamber illustrating a wafer lifter situated inside the chamber.

FIG. 2 is a perspective view of the conventional physical vapor deposition chamber of FIG. 1.

FIG. 3 is a perspective view of the present invention wafer lifter with improved wafer support fingers.

DETAILED DESCRIPTION OF THE PREFERRED EMBODIMENT

Figure 4A:
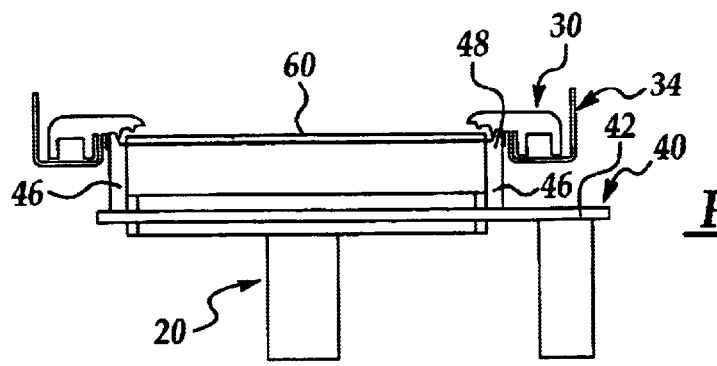
FIG. 4A is a cross-sectional view illustrating the present invention wafer lifter in a lifted position.

The present invention discloses an apparatus and a method for self-centering a wafer onto a wafer pedestal situated in a physical vapor deposition chamber, i.e., in a sputter chamber.

The apparatus of a wafer lifter is used for self-centering a wafer onto the pedestal which is constructed by a lifter body of annular shape that has a center cavity with a diameter larger than a diameter of the wafer pedestal; at least four support fingers emanating upwardly from the lifter body at approximately 90° and are substantially equally spaced apart from each other; and a platform on a tip portion of each of the at least four support fingers defined by a slanted surface as measured from a vertical plane of an outside surface of the support finger. When a wafer is supported by the platform of each of the at least four support fingers, substantially no gap is formed between the slanted surface and the outer periphery of the wafer.

Referring now to FIG. 3, wherein a present invention wafer lifter 40 is shown. The wafer lifter consists of a lifter body 42 formed of an annular, or ring-shape with a center cavity 44. The center cavity 44 has a diameter that is larger than a diameter of the wafer pedestal 20 (shown in FIG. 2) such that a wafer can be loaded onto the pedestal 20 when the lifter 40 is lowered onto the pedestal. The lifter body 42 further includes at least four support fingers 46 each emanating upwardly from a top surface 48 of the lifter body 42 and are spaced-apart from each other. In the configuration shown in FIG. 3, the four support fingers 46 are spaced-apart from each other at substantially the same distance.

Figure 5A:
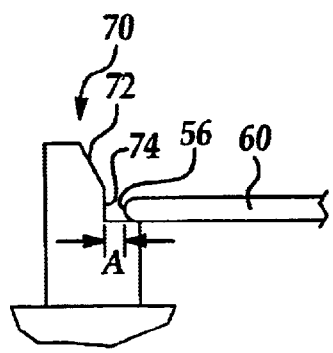
FIG. 5A is an enlarged, cross-sectional view of the tip portion of a conventional support finger.
Figure 5B:
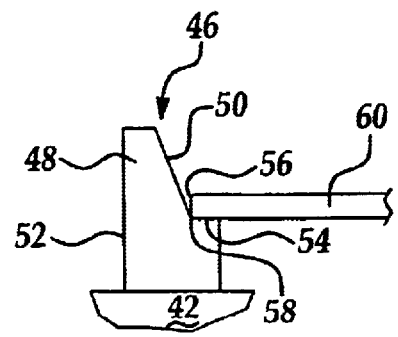
FIG. 5B is an enlarged, cross-sectional view of the tip portion of a present invention support finger.

An enlarged, detailed view of the support finger 46 of the lifter body 42 is shown in FIG. 5B. It is seen that the support finger 46 has a tip portion 48 defined by a slanted surface 50 which is slanted from a vertical plane of an outside surface 52 of the support finger 46. The platform 54, when support a wafer 60 thereon, leaves substantially no gap between the slanted surface 50 and an outer periphery 56 of the wafer 60.

The support finger 46 can be compared, in contrast, to a conventional support finger 70 shown in FIG. 5A. The conventional support finger 70 is equipped with a slanted surface 72, however, intercepted by a vertical surface 74 and thus leaving a gap "A" between the vertical surface 74 and the outer periphery 56 of the wafer 60. The gap "A" shown in FIG. 5A is the major contributing factor for wafer shifting during a wafer loading process onto a pedestal leading to deposition and quality problems.

Referring now to FIG. 5B, a base 58 of the slanted shoulder portion 48, or the tip portion, of the support finger 46 defines a diameter of a circular (not shown) surrounded by the platforms 54 of the at least four support fingers. The circular area formed is not larger than a diameter of the wafer to be carried by the support fingers when measured at room temperature, i.e., at about 23° C. The design is such that when the wafer lifter is used in a fabrication process, the high temperature of the sputter chamber expands the wafer lifter and thus a small gap, such as 0.5 mm, between the wafer and the slanted shoulder portion is provided.

Figure 4B:
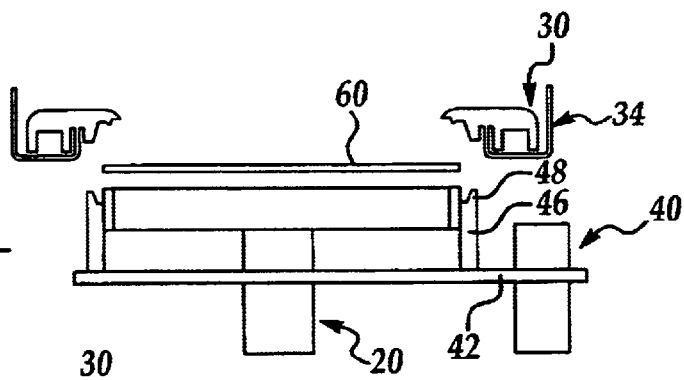
FIG. 4B is a cross-sectional view of the present invention wafer lifter in a wafer released position.

The present invention further discloses a method for self-centering a wafer onto a wafer pedestal situated in a physical vapor deposition chamber. The method can be carried out by first providing a wafer lifter as described above, then positioning a wafer on the wafer lifter 40, as shown in FIG. 4A, supported by the platform 54 on the tip portion of the support fingers 46. The wafer lifter 40 is then lifted to a position over the pedestal 20 and the wafer is deposited on to the pedestal 20, as shown in FIG. 4B. It should be noted that other than the components described above, FIGS. 4A, 4B and 4C also show a clamp ring 30 which was discussed in FIG. 1. Similarly, a chamber shield 34 is also shown in these Figures and was discussed in FIG. 1.

Figure 4C:
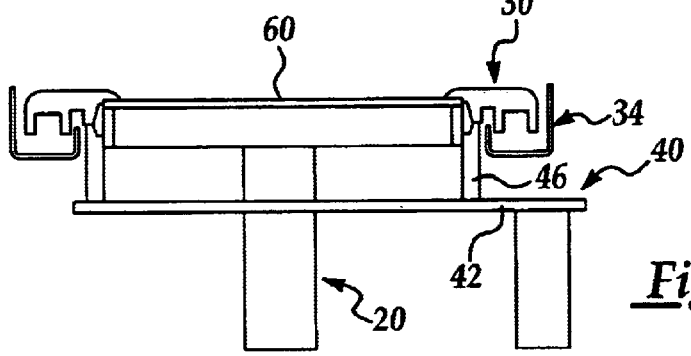
FIG. 4C is a cross-sectional view of the present invention wafer lifter in a process position.

In the final stage of the process, as shown in a process position in FIG. 4C, the wafer pedestal 20 is moved up to the process position, i.e., the edge of the wafer 60 is covered by the clamp ring 30 while the wafer lifter 40 is released from the pedestal 20.

The present invention novel apparatus and method for self-centering a wafer onto a wafer pedestal in a physical vapor deposition chamber have therefore been amply described in the above descriptions and in the appended drawings of FIGS. 3, 4A–4C and 5B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A wafer lifter for self-centering a wafer on a pedestal comprising:
    a lifter body of annular shape having a center cavity with a diameter that is larger than a diameter of the wafer pedestal, said lifter body is fabricated of a material that has a rigidity of at least that of aluminum;
    at least four support fingers emanating upwardly from said lifter body and are spaced-apart from each other; and
    a platform on a tip portion of each of said at least four support fingers defined by a slanted surface from a vertical plane of an outside surface of said support finger, said platform when supporting a wafer thereon leaves substantially no gap between said slanted surface and an outer periphery of the wafer.

2. A wafer lifter for self-centering a wafer on a pedestal according to claim 1, wherein a base of said slanted shoulder portion of the support finger defines a diameter of a circular area surrounded by the platforms of the at least four support fingers which is not larger than a diameter of said wafer when measured at 23° C.

3. A wafer lifter for self-centering a wafer on a pedestal according to claim 1, wherein said at least four support fingers are substantially equally spaced-apart from each other.

4. A wafer lifter for self-centering a wafer on a pedestal according to claim 1, wherein said platform when supporting a wafer thereon leaves a gap smaller than 0.5 mm between said slanted surface and said outer periphery of the wafer.

5. A wafer lifter for self-centering a wafer on a pedestal according to claim 1, wherein said lifter is equipped with four support fingers emanating upwardly from said body.

6. A wafer lifter for self-centering a wafer on a pedestal according to claim 1, wherein said lifter body is equipped with four support fingers emanating upwardly from said body at a 90° angle from a horizontal plane of said body.

7. A wafer lifter for self-centering a wafer on a pedestal according to claim 1, wherein said lifter body has a ring shape.

8. A method for self-centering a wafer on a wafer pedestal comprising the steps of:
    fabricating a lifter body for a wafer lifter with a material that has a rigidity of at least that of aluminum, said lifter body having an annular shape and a center cavity with a diameter that is larger than a diameter of said wafer pedestal, said wafer lifter further having at least four support fingers emanating upwardly from said lifter body and are spaced-apart from each other, and a platform on a tip portion of each of said at least four support fingers defined by a slanted surface from a vertical plane of an outside surface of said support finger, said platform when supporting a wafer thereon leaves substantially no gap between said slanted surface and an outer periphery of the wafer;
    positioning a wafer on said wafer lifter supported by said platform on said tip portion of the at least four support fingers; and
    lifting said wafer lifter to pedestal and depositing said wafer onto a position over said wafer onto said pedestal.

9. A method for self-centering a wafer on a wafer pedestal according to claim 8 further comprising the step, after said lifting step, of lowering said wafer lifter to deposit said wafer onto said wafer pedestal.

10. A method for self-centering a wafer on a wafer pedestal according to claim 8 further comprising the step of sputter depositing a metal layer on a top surface of said wafer.

11. A method for self-centering a wafer on a wafer pedestal according to claim 8 further comprising the step of self-centering the wafer on said wafer lifter during said positioning when said wafer is guided into a center position by said slanted surface on said tip portion of the at least four support fingers.

12. A method for self-centering a wafer on a wafer pedestal according to claim 8 further comprising the step of providing four support fingers that are vertically mounted on said lifter body.

* * * * *